United States Patent
Liao et al.

(10) Patent No.: US 6,171,914 B1
(45) Date of Patent: Jan. 9, 2001

(54) SYNCHRONIZED IMPLANT PROCESS TO SIMPLIFY NLDD/PLDD STAGE AND N+/P+ STAGE INTO ONE IMPLANT

(75) Inventors: Ni-Ko Liao, Miaoli; San-De Tzu, Taipei, both of (TW)

(73) Assignee: Taiwan Semiconductor Manufacturing Company, Hsin-Chu (TW)

( * ) Notice: Under 35 U.S.C. 154(b), the term of this patent shall be extended for 0 days.

(21) Appl. No.: 09/332,432

(22) Filed: Jun. 14, 1999

(51) Int. Cl.$^7$ .................................................. H01L 21/331
(52) U.S. Cl. .......................... 438/302; 438/510; 438/514
(58) Field of Search .................... 438/514, 510, 438/199, 229, 230, 299, 301, 302, 303, 306

(56) References Cited

U.S. PATENT DOCUMENTS

| | | | |
|---|---|---|---|
| 4,771,014 | 9/1988 | Liou et al. | 437/41 |
| 5,141,891 | 8/1992 | Arima et al. | 437/44 |
| 5,567,629 | * 10/1996 | Kubo | 438/286 |
| 5,780,903 | 7/1998 | Tsai et al. | 257/344 |
| 5,858,847 | 1/1999 | Zhou et al. | 438/305 |
| 5,882,974 | * 3/1999 | Gardner et al. | 438/286 |
| 5,888,861 | * 3/1999 | Chien et al. | 438/202 |

OTHER PUBLICATIONS

Wolf, S., Tauber R.N.; Silicon Processing for the VLSI Era vol. 1: Process Technology, Lattice Press, Sunset Beach, CA, 1986, pp. 501–504.*

Chang et al., "ULSI Technology," The McGraw–Hill Co., Inc., New York, NY, c.1996, p. 480.

* cited by examiner

Primary Examiner—John F. Niebling
Assistant Examiner—Christopher Lattin
(74) Attorney, Agent, or Firm—George O. Saile; Stephen B. Ackerman; Rosemary L. S. Pike

(57) ABSTRACT

A method of source/drain and LDD implantation using a single implantation step is described. A gate electrode is formed in an active area on surface of a semiconductor substrate. The gate electrode and the semiconductor substrate are covered with a resist layer. The resist layer in the active area is exposed to lithography source, such as electron-beam direct writing, or other process, wherein a portion of the resist layer overlying the planned LDD regions is exposed to a first energy and a portion of the resist layer overlying the planned source/drain regions is exposed to a second energy greater than the first energy and wherein a portion of the resist layer outside of the active area is not exposed. The resist layer is developed to leave a resist mask having a first thickness in areas not exposed and to leave a resist mask having a second thickness in areas exposed to the first energy and to leave no resist mask in areas exposed to the second energy. Ions are implanted into the semiconductor substrate adjacent to the gate electrode wherein the ions implanted through no resist mask form the source/drain regions and wherein the ions implanted through the resist mask having the second thickness form the LDD regions to complete said simultaneous fabrication of the source/drain regions and LDD regions.

23 Claims, 3 Drawing Sheets

SYNCHRONIZED IMPLANT PROCESS TO SIMPLIFY NLDD/PLDD STAGE AND N+/P+ STAGE INTO ONE IMPLANT

BACKGROUND OF THE INVENTION

(1) Field of the Invention

The invention relates to the fabrication of integrated circuit devices, and more particularly, to a method of forming both NLDD and N+ or PLDD and P+ regions in one implantation in the fabrication of integrated circuits.

(2) Description of the Prior Art

In scaling down semiconductor devices, thinner gate oxide and higher doped channels are required for short channel devices. These measures increase the electric field near the drain regions. Charge carriers are accelerated by the electric field and become "hot" carriers. These hot carriers can overcome the oxide barrier and inject into the gate or become trapped in the gate oxide degrading device performance. This is the so-called hot carrier effect and is discussed, for example, in *ULSI Technology*, by C. Y. Chang and S. M. Sze, McGraw-Hill Co, Inc, New York, N.Y., c. 1996, p. 480. The lightly doped drain (LDD) reduces this drain field, thereby alleviating the hot carrier effect. However, the conventional LDD process takes much cycle time and strenuous steps. The drain is conventionally formed by two implants.

U.S. Pat. No. 4,771,014 to Liou et al teaches a LDD CMOS process using unmasked blanket implants. U.S. Pat. No. 5,858,847 to Zhou et al forms the source/drain first using a photoresist block, and then implanting the LDD. U.S. Pat. No. 5,141,891 to Arima et al discloses a polysilicon source drain (PSD) and a LDD structure. U.S. Pat. No. 5,780,903 to Tsai et al forms an LDD using a photoresist ion implant mask and two implantations.

SUMMARY OF THE INVENTION

A principal object of the present invention is to provide an effective and very manufacturable method of source/drain and LDD implantation.

A further object of the invention is to provide a method of source/drain and LDD implantation using a single implantation step.

Yet another object is to provide a method of source/drain and LDD implantation wherein a single implantation through different resist thicknesses results in the simultaneous formation of both the source/drain and LDD regions.

In accordance with the objects of this invention, a method of source/drain and LDD implantation using a single implantation step is achieved. A gate electrode is formed in an active area on surface of a semiconductor substrate. The gate electrode and the semiconductor substrate are covered with a resist layer. The resist layer in the active area is exposed to lithography source, such as electron-beam direct writing, or other process, wherein a portion of the resist layer overlying the planned LDD regions is exposed to a first energy and a portion of the resist layer overlying the planned source/drain regions is exposed to a second energy greater than the first energy and wherein a portion of the resist layer outside of the active area is not exposed. The resist layer is developed to leave a resist mask having a first thickness in areas not exposed and to leave a resist mask having a second thickness in areas exposed to the first energy and to leave no resist mask in areas exposed to the second energy. Ions are implanted into the semiconductor substrate adjacent to the gate electrode wherein the ions implanted through no resist mask form the source/drain regions and wherein the ions implanted through the resist mask having the second thickness form the LDD regions to complete said simultaneous fabrication of the source/drain regions and LDD regions in the fabrication of an integrated circuit device.

BRIEF DESCRIPTION OF THE DRAWINGS

In the accompanying drawings forming a material part of this description, there is shown.

DESCRIPTION OF THE PREFERRED EMBODIMENTS

Figure 1:
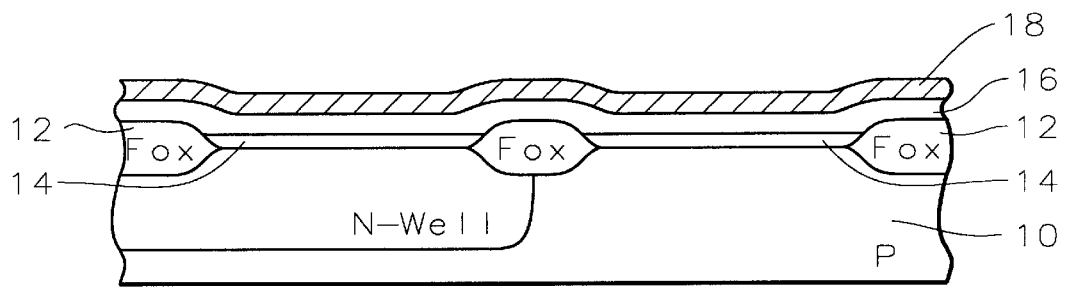
FIGS. 1 through 8 schematically illustrate in cross-sectional representation a preferred embodiment of the present invention.

Referring now more particularly to FIG. 1, there is shown an illustration of a partially completed metal oxide field effect transistor (MOSFET). The semiconductor substrate 10 is preferably composed of silicon having a (100) crystallographic orientation. Active areas of the device are separated by isolation areas, such as field oxide regions 12. For example, the substrate may be P-doped. An N-well may be formed by conventional means in an active area that is to contain the PMOS devices. An active area without an N-well will contain NMOS devices.

The surface of the silicon substrate 10 is thermally oxidized to form the desired gate oxide 14 thickness. The preferred thickness is between about 60 to 140 Angstroms.

The polysilicon layer 16 is deposited by low pressure chemical vapor deposition (LPCVD) to a thickness of between about 1000 to 2000 Angstroms. The layer 16 can be doped in situ or doped after its deposition. A polycide layer 18 may be formed overlying the polysilicon layer. For example, tungsten silicide may be deposited over the polysilicon layer to a thickness of between about 1250 and 2000 Angstroms.

Figure 2:
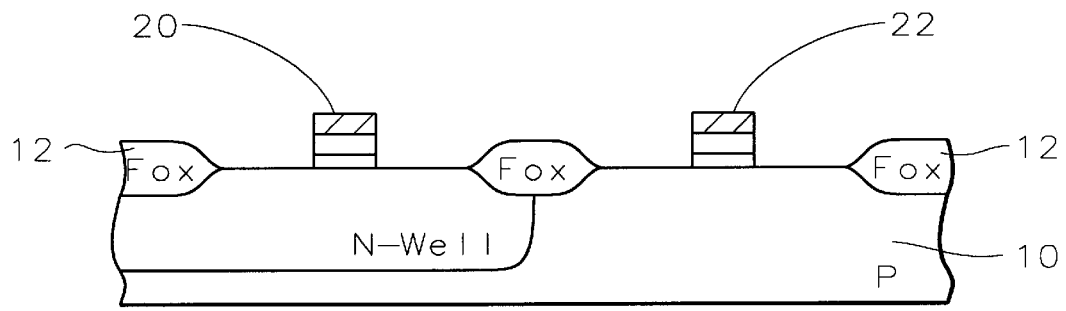

The layers 14, 16, and 18 are patterned by conventional lithography to provide the desired pattern of gate electrodes and interconnection lines as shown in FIG. 2. For example, gate electrode 20 will be a PMOS device. Gate electrode 22 will be a NMOS device.

Figure 3:
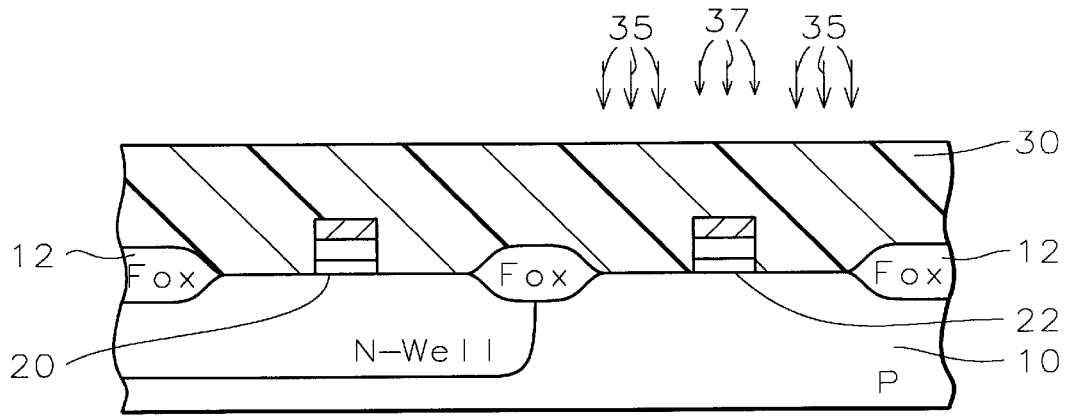

The source/drain and LDD structure of the MOS FET may now be formed by the single implantation method of the invention. In the example illustrated here, the NMOS S/D and LDD will be formed first. A layer of photoresist 30 is blanket deposited over the entire surface of the substrate to a thickness of between about 10,000 to 20,000 Angstroms. The NLDD and N+ patterns are exposed at the same time using electron beam direct writing or other lithography techniques, for example laser or X-ray direct writing, to generate resists with different thicknesses. For example, electron-beam or other exposure 35 and 37 is illustrated in FIG. 3. A lower energy exposure 37 is made where the LDD regions are desired.

Figure 4A:
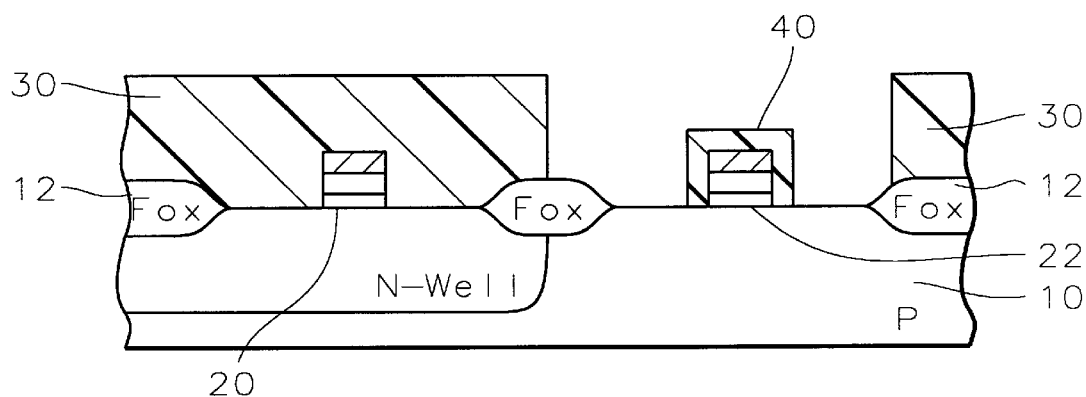
Figure 4B:
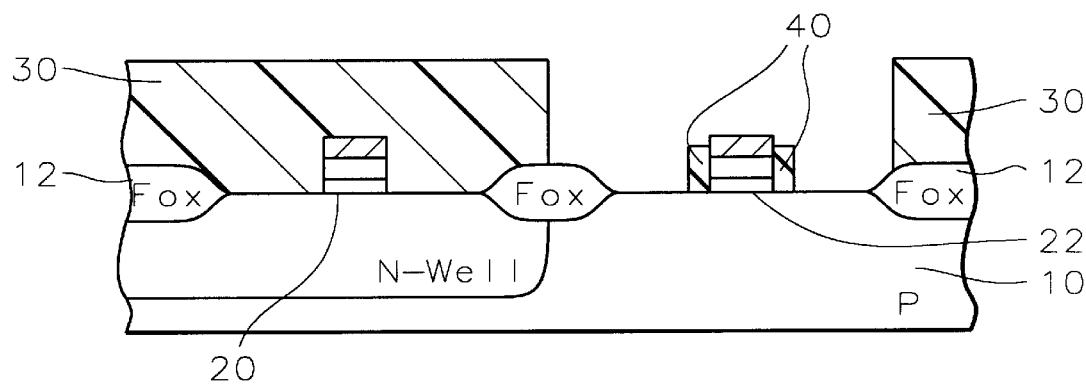

The photoresist is developed after exposure to leave the photoresist mask shown in FIG. 4A. The thick photoresist mask 30 covers the areas not to be implanted. A thinner photoresist mask 40 covers the planned LDD regions. FIG. 4B illustrates an alternate thinner resist profile 40 in which the photoresist mask 40 does not cover the top surface of the gate electrode 22, but remains only on the sidewalls of the gate electrode.

The two levels of resist profile, 30 and 40, allow for a simultaneous formation of N+ and NLDD regions using a single ion implantation. The different dosages for the N+ and NLDD regions will be implanted at the same time because the controlled thickness of the photoresist masks 30 and 40 will resist a specified concentration of dosage and result in the preferred dosage in the N+ and NLDD regions simultaneously. The resist profile; that is, thickness; is tuned so that the N+ implantation after resist screening by the photoresist mask 40 is trimmed down to the appropriate energy and dosage for the NLDD regions. Different resist materials may require different thicknesses to control dosage and implant depth.

For example, if a 50 KeV electron beam direct writing machine is used to write on a resist of 10,000 Angstroms, a dosage of between 25 and 35 $\mu c/cm^2$ is used to open the planned source/drain regions. The thickness of the thinner photoresist 40 remaining on the planned LDD regions depends upon the e-beam dosage applied (37).

Figure 5:
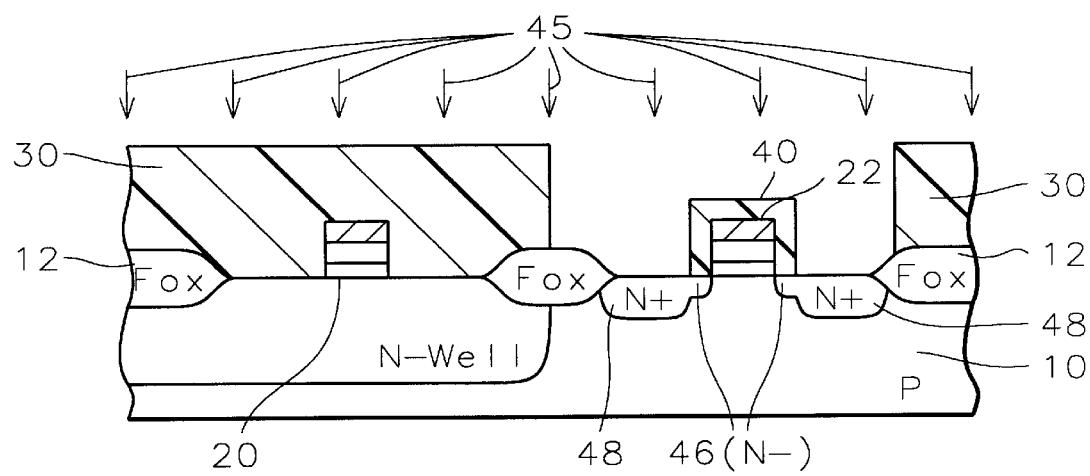

FIG. 5 illustrates the single N+/NLDD ion implantation 45. For example, N+ ions, such as arsenic or phosphorus are implanted with a dosage of between about $1 \times 10^{15}$ and $5 \times 10^{15}$ atoms/cm$^2$ and energy of between about 15 and 80 KeV to simultaneously form N+ source and drain regions 48 and N-LDD regions 46.

Figure 6:
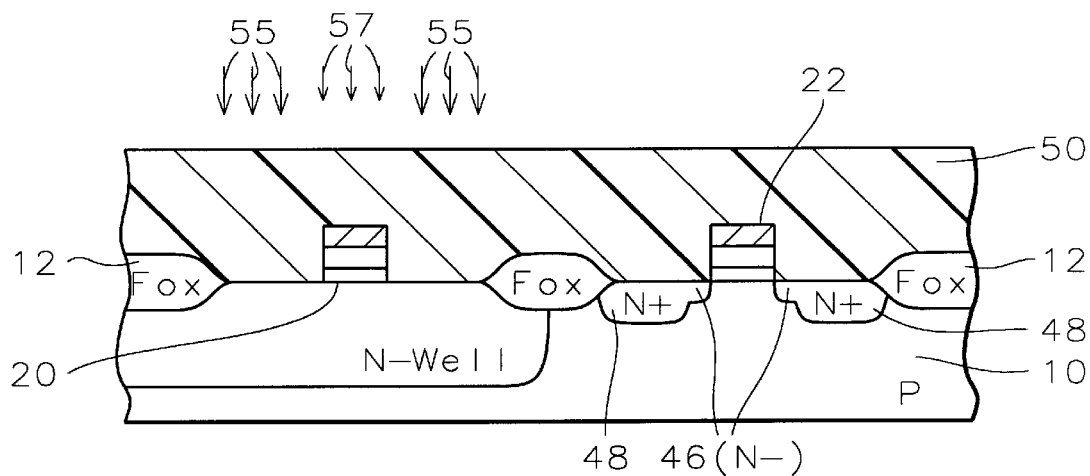

The photoresist 30 and 40 is stripped and the process of the invention is repeated for the PMOS active area. Referring now to FIG. 6, a layer of photoresist 50 is blanket deposited over the entire surface of the substrate to a thickness of between about 10,000 to 20,000 Angstroms. The PLDD and P+ patterns are exposed at the same time using electron beam direct writing or other lithography techniques, for example laser or X-ray direct writing, to generate resists with different thicknesses. For example, electron-beam or other exposure 55 and 57 is illustrated in FIG. 6. A lower energy exposure 57 is made where the LDD regions are desired.

Figure 7:
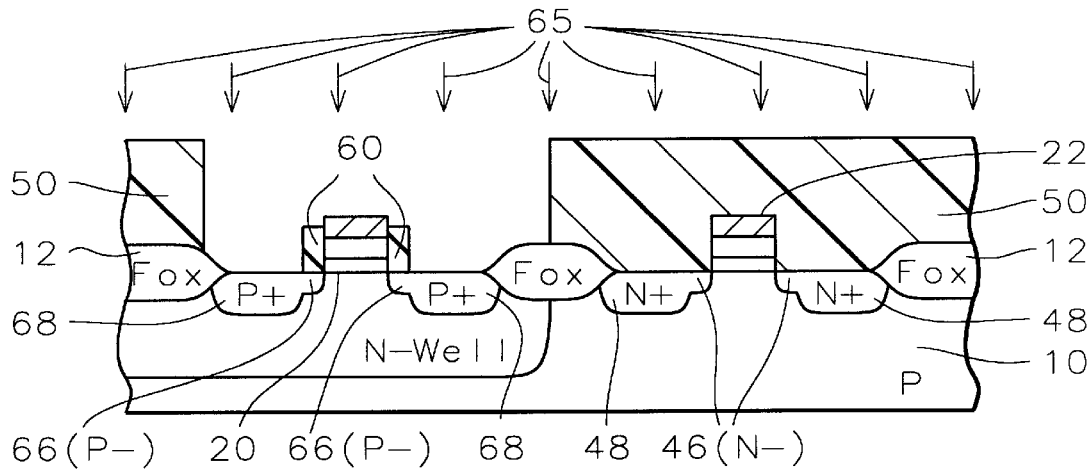

The photoresist is developed after exposure to leave the photoresist mask shown in FIG. 7. The thick photoresist mask 50 covers the areas not to be implanted, including the already completed NMOS areas. A thinner photoresist mask 60 covers the planned LDD regions. This figure illustrates the alternate thinner resist profile 60 in which the photoresist mask 60 does not cover the top surface of the gate electrode 20, but remains only on the sidewalls of the gate electrode. As in the NMOS case above, the mask 40 may cover the top surface of the gate electrode as well, as shown in FIG. 4A.

The two levels of resist profile, 50 and 60, allow for a simultaneous formation of P+ and PLDD regions using a single ion implantation. The different dosages for the P+ and PLDD regions will be implanted at the same time because the controlled thickness of the photoresist masks 50 and 60 will resist a specified concentration of dosage and result in the preferred dosage in the P+ and PLDD regions simultaneously. The resist profile; that is, thickness; is tuned so that the P+ implantation after resist screening by the photoresist mask 60 is trimmed down to the appropriate energy and dosage for the PLDD regions. Different resist materials may require different thicknesses to control dosage and implant depth.

FIG. 7 illustrates the single P+/PLDD ion implantation 65. For example, P+ ions, such as $BF_2$ or $B^+$, are implanted with a dosage of between about $1 \times 10^{15}$ and $5 \times 10^{15}$ atoms/cm$^2$ and energy of between about 15 and 80 KeV to simultaneously form P+ source and drain regions 68 and P-LDD regions 66.

Figure 8:
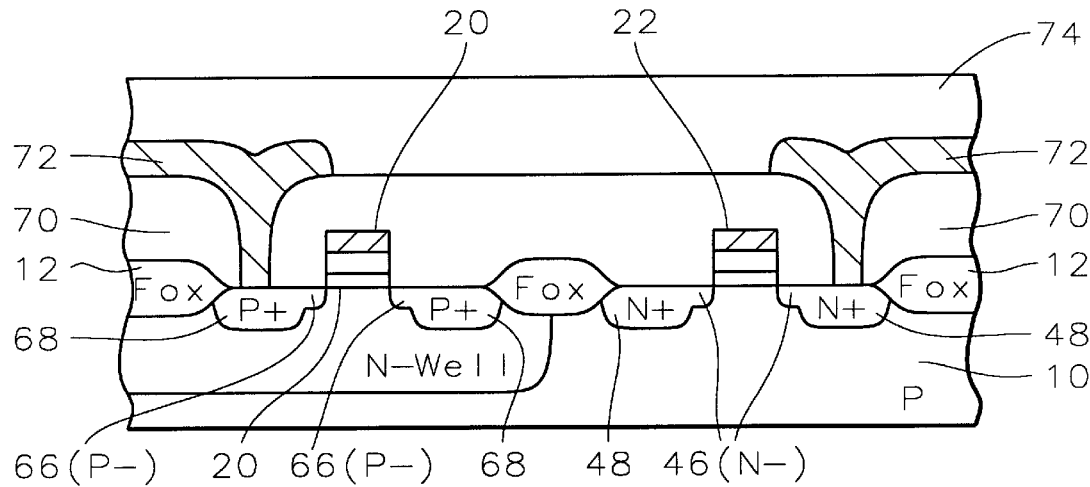

The integrated circuit device is completed as is conventional in the art. For example, as shown in FIG. 8, a thick insulating layer 70 is blanket deposited over the wafer's surfaces. Openings are etched through the insulating layer 70 to the underlying semiconductor device structures to be contacted, such as source/drain regions 48 and 68. A metal layer 72 is deposited and patterned and then passivated with insulating layer 74. Higher level metallization, not shown, may be fabricated as required.

The process of the invention provides a method for forming both source/drain and LDD regions using a single ion implantation. The photoresist thickness is controlled by whatever means desired, such as by electron beam direct writing or other method, so that the photoresist thickness over the planned LDD regions reduces the implant dosage and energy in a controlled way to form LDD regions simultaneously with source/drain regions.

While the invention has been particularly shown and described with reference to the preferred embodiments thereof, it will be understood by those skilled in the art that various changes in form and details may be made without departing from the spirit and scope of the invention.

What is claimed is:

1. A method of simultaneously fabricating source/drain regions and LDD regions in the fabrication of an integrated circuit device comprising:

forming a gate electrode in an active area on the surface of a semiconductor substrate;

covering said gate electrode and said semiconductor substrate with a resist layer;

exposing said resist layer in said active area wherein a portion of said resist layer overlying planned said LDD regions is exposed to a first dosage/energy and portion of said resist layer overlying planned said source/drain regions is exposed to a second dosage/energy and wherein a portion of said resist layer outside of said active area is not exposed;

developing said resist layer to leave a resist mask having a first thickness in areas not exposed and to leave a resist mask having a second thickness in areas exposed to said first dosage/energy and to leave no resist mask in areas exposed to said second dosage/energy; and implanting ions into said semiconductor substrate adjacent to said gate electrode wherein said ions implanted through no resist mask form said source/drain regions and wherein said ions implanted through said resist mask having said second thickness form said LDD regions to complete said simultaneous fabrication of said source/drain regions and said LDD regions in the fabrication of an integrated circuit device.

2. The method according to claim 1 wherein said step of exposing said resist layer exposes said resist layer to electron-beam direct writing.

3. The method according to claim 1 wherein said step of exposing said resist layer exposes said resist layer to laser direct writing.

4. The method according to claim 1 wherein said step of exposing said resist layer exposes said resist layer to X-ray direct writing.

5. The method according to claim 1 wherein said resist mask having said second thickness overlies a top surface and side surfaces of said gate electrode.

6. The method according to claim 1 wherein said resist mask having said second thickness overlies side surfaces but not said top surface of said gate electrode.

7. The method according to claim 1 wherein said source/drain and said LDD regions are NMOS regions and wherein said ions comprise one of the group containing arsenic and phosphorus.

8. The method according to claim 1 wherein said source/drain and said LDD regions are PMOS regions and wherein said ions comprise one of the group containing $BF_2$ and boron.

9. The method according to claim 1 further comprising:
depositing an insulating layer over the surface of said substrate;
etching an opening through said insulating layer to one of said source and drain regions; and
depositing a conducting layer overlying said insulating layer and within said opening and patterning said conducting layer completing the fabrication of said integrated circuit device.

10. A method of simultaneously fabricating source/drain regions and LDD regions in the fabrication of an integrated circuit device comprising:
forming a gate electrode in an active area on the surface of a semiconductor substrate; covering said gate electrode and said semiconductor substrate with a resist layer;
exposing said resist layer in said active area wherein a portion of said resist layer overlying planned said LDD regions is exposed to a first dosage/energy and a portion of said resist layer overlying planned said source/drain regions is exposed to a second dosage/energy greater than said first dosage/energy and wherein a portion of said resist layer outside of said active area is not exposed;
developing said resist layer to leave a resist mask having a first thickness in areas not exposed and to leave a resist mask having a second thickness in areas exposed to said first dosage/energy and to leave no resist mask in areas exposed to said second dosage/energy;
implanting ions into said semiconductor substrate adjacent to said gate electrode wherein said ions implanted through no resist mask form said source/drain regions and wherein said ions implanted through said resist mask having said second thickness form said LDD regions to complete said simultaneous fabrication of said source/drain regions and said LDD regions;
depositing an insulating layer over the surface of said substrate;
etching an opening through said insulating layer to one of said source and drain regions; and
depositing a conducting layer overlying said insulating layer and within said opening and patterning said conducting layer completing the fabrication of said integrated circuit device.

11. The method according to claim 10 wherein said step of exposing said resist layer exposes said resist layer to electron-beam direct writing.

12. The method according to claim 10 wherein said step of exposing said resist layer exposes said resist layer to laser direct writing.

13. The method according to claim 10 wherein said step of exposing said resist layer exposes said resist layer to X-ray direct writing.

14. The method according to claim 10 wherein said resist mask having said second thickness overlies a top surface and side surfaces of said gate electrode.

15. The method according to claim 10 wherein said resist mask having said second thickness overlies side surfaces but not said top surface of said gate electrode.

16. The method according to claim 10 wherein said source/drain and said LDD regions are NMOS regions and wherein said ions comprise one of the group containing arsenic and phosphorus.

17. The method according to claim 10 wherein said source/drain and said LDD regions are PMOS regions and wherein said ions comprise one of the group containing $BF_2$ and boron.

18. A method of simultaneously fabricating source/drain regions and LDD regions in the fabrication of an integrated circuit device comprising:
forming a gate electrode in an active area on the surface of a semiconductor substrate;
covering said gate electrode and said semiconductor substrate with a photoresist layer;
exposing said photoresist layer in said active area to a direct writing lithography process a wherein a portion of said photoresist layer overlying planned said LDD regions is exposed to a first energy and a portion of said photoresist layer overlying planned said source/drain regions is exposed to a second energy greater than said first energy and wherein a portion of said photoresist layer outside of said active area is not exposed;
developing said photoresist layer to leave a photoresist mask having a first thickness in areas not exposed and to leave a photoresist mask having a second thickness in areas exposed to said first energy and to leave no photoresist mask in areas exposed to said second energy;
implanting ions into said semiconductor substrate adjacent to said gate electrode wherein said ions implanted through no photoresist mask form said source/drain regions and wherein said ions implanted through said photoresist mask having said second thickness form said LDD regions to complete said simultaneous fabrication of said source/drain regions and said LDD regions;
depositing an insulating layer over the surface of said substrate;
etching an opening through said insulating layer to one of said source and drain regions; and
depositing a conducting layer overlying said insulating layer and within said opening and patterning said conducting layer completing the fabrication of said integrated circuit device.

19. The method according to claim 18 wherein said direct writing lithography process comprises exposure to one of the group containing electron-beam, laser, and X-ray sources.

20. The method according to claim 18 wherein said resist mask having said second thickness overlies a top surface and side surfaces of said gate electrode.

21. The method according to claim 18 wherein said resist mask having said second thickness overlies side surfaces but not said top surface of said gate electrode.

22. The method according to claim 18 wherein said source/drain and said LDD regions are NMOS regions and wherein said ions comprise one of the group containing arsenic and phosphorus.

23. The method according to claim 18 wherein said source/drain and said LDD regions are PMOS regions and wherein said ions comprise one of the group containing $BF_2$ and boron.

* * * * *